(12) United States Patent
Tonezzer et al.

(10) Patent No.: US 12,439,703 B2
(45) Date of Patent: Oct. 7, 2025

(54) PHOTOVOLTAIC SYSTEM

(71) Applicant: POWERGLAX S.R.L., Vallelaghi (IT)

(72) Inventors: Michele Tonezzer, Altopiano della Vigolana (IT); Donato Vincenzi, Ferrara (IT); Paolo Decarli, Vallelaghi (IT); Paolo Bernardoni, Ferrara (IT)

(73) Assignee: POWERGLAX S.R.L., Vallelaghi (IT)

( * ) Notice: Subject to any disclaimer, the term of this patent is extended or adjusted under 35 U.S.C. 154(b) by 0 days.

(21) Appl. No.: 18/697,852

(22) PCT Filed: Sep. 29, 2022

(86) PCT No.: PCT/IB2022/059275
§ 371 (c)(1),
(2) Date: Apr. 2, 2024

(87) PCT Pub. No.: WO2023/057859
PCT Pub. Date: Apr. 13, 2023

(65) Prior Publication Data
US 2025/0241073 A1 Jul. 24, 2025

(30) Foreign Application Priority Data
Oct. 8, 2021 (IT) .................. 102021000025865

(51) Int. Cl.
*H10F 19/35* (2025.01)
*H10F 19/90* (2025.01)
(52) U.S. Cl.
CPC .......... *H10F 19/35* (2025.01); *H10F 19/90* (2025.01)

(58) Field of Classification Search
CPC ................................ H10F 19/35; H10F 19/90
See application file for complete search history.

(56) References Cited

U.S. PATENT DOCUMENTS

| | | | |
|---|---|---|---|
| 6,262,358 B1 * | 7/2001 | Kamimura | H10F 19/80 136/246 |
| 9,526,132 B2 | 12/2016 | Palfreyman | |
| 2001/0007138 A1 * | 7/2001 | Iida | G06F 11/0709 714/25 |
| 2001/0029059 A1 * | 10/2001 | Lin | H10F 39/805 438/48 |
| 2002/0153581 A1 * | 10/2002 | Lin | H01L 24/97 257/E31.119 |

(Continued)

FOREIGN PATENT DOCUMENTS

| | | | | |
|---|---|---|---|---|
| CN | 109560147 A | * | 4/2019 | .......... H01L 23/544 |
| KR | 20180000051 U | | 1/2018 | |

OTHER PUBLICATIONS

International Search Report dated Jan. 19, 2023 from counterpart PCT App No. PCT/IB2022/059275.

*Primary Examiner* — Golam Mowla
(74) *Attorney, Agent, or Firm* — SHUTTLEWORTH & INGERSOLL, PLC; Timothy J. Klima

(57) ABSTRACT

Described is a flexible composite strip including a flexible printed circuit comprising at least a first and a second conductor track, a plurality of groups of photovoltaic cells being connected in parallel to said first and second tracks for supplying them; the composite strip comprises a plurality of soldering pads at which the first and second conductor tracks are accessible; the flexible composite strip is configured to be cut at the soldering pads.

16 Claims, 4 Drawing Sheets

(56) References Cited

U.S. PATENT DOCUMENTS

| | | | |
|---|---|---|---|
| 2004/0144043 A1* | 7/2004 | Stevenson | H10F 19/80 52/173.3 |
| 2005/0072456 A1* | 4/2005 | Stevenson | H02S 20/23 136/251 |
| 2009/0301544 A1 | 12/2009 | Minelli | |
| 2011/0272006 A1* | 11/2011 | Sainoo | H10F 19/80 136/251 |
| 2015/0206987 A1 | 7/2015 | Ohhashi | |
| 2020/0143995 A1 | 5/2020 | Vak | |
| 2020/0321908 A1 | 10/2020 | Anders | |

* cited by examiner

PHOTOVOLTAIC SYSTEM

This application is the National Phase of International Application PCT/IB2022/059275 filed Sep. 29, 2022 which designated the U.S.

This application claims priority to Italian Patent Application No. 102021000025865 filed Oct. 8, 2021, which application is incorporated by reference herein.

TECHNICAL FIELD

This invention relates to a photovoltaic module designed, in particular, for windows or French windows.

BACKGROUND ART

Luminescent Solar Concentrators (LSC) are devices based on a sheet or film provided with dye molecules which are able to capture a portion of incident solar radiation and re-emit it. A portion of the radiation emitted by the dye molecules remains trapped inside the film/sheet due to the phenomenon of total internal reflection.

If the sheet or film has a sufficiently smooth air interface, the portion of fluorescence light trapped inside said sheet or film undergoes a multiple reflection process from one interface to the other and reaches the perimeter of the same.

On the lateral surface of the sheet/film there are photovoltaic cells arranged in modules, called arrays, which convert the fraction of luminescence radiation trapped inside said sheet/film into electrical current. This electrical current may be advantageously used for powering external users, such as lights, recharging systems, shading or integrated lighting systems, etc. or may be stored in local storage systems or it may be introduced into the grid.

The photovoltaic cells located on the edge of the luminescent sheet are usually connected in series with each other in order to sum up the potential difference generated by each cell, thus minimising the ohmic losses due to the interconnections between one cell and another.

The current flowing inside the string of photovoltaic cells is limited by the current delivered by the less illuminated cell. Unfortunately, any local shading of the luminescent sheet results in non-uniform illumination of the array of photovoltaic cells and, in the case of connection in series, a loss of overall efficiency linked to the limitation of current induced by the less illuminated device.

This problem can be overcome by using a parallel connection of the photovoltaic cells. In that case, the current generated by the array is the sum of the current generated by each photovoltaic device, whilst the potential difference is almost constant, irrespective of the level of illumination of the cells.

In the case of luminescent solar concentrators, the density of current generated by the photovoltaic devices may be some tens of mA/cm2 and the connection in parallel may lead to arrays which deliver an overall current of several amperes. The greater the current flowing in the circuit, the greater the ohmic losses due to the electrical resistance of the interconnections and contacts.

The choice, which is typically made in the production of photovoltaic arrays for luminescent concentrators, is the production of series-parallel circuits where the cells are soldered on a printed circuit which provides the electrical connection of the individual photovoltaic devices and also acts as a mechanical support.

If the cells are organised in arrays, the difference in potential generated by the cells connected in series is greater than that of the single photovoltaic device and the current is less than that which would be obtained in the case of connection in parallel of all the photovoltaic devices.

Typically, the arrays used in luminescent solar concentrators consist of 20-30 photovoltaic devices connected in series to each other. Subsequently, the various arrays are connected in parallel with each other. The printed circuit of the photovoltaic arrays typically has a length ranging from 10 cm to 30 cm and a width slightly greater than the thickness of the luminescent sheet (6-15 mm).

Thanks to the mixed series-parallel connection, any local variations of illumination of the luminescent sheet do not limit the overall current delivered from the entire module, but only that delivered by the single array.

Each photovoltaic array is connected to the next one via substantially known board-to-board connectors, that allow the assembly of arrays of arbitrary length, even of several meters.

The greater the length of each array, the smaller the number of interconnections required for a certain overall length, and as a result, the lower the cost of the interconnecting components.

On the other hand, the greater the length of each array, the greater the sensitivity of the module to any and inevitable local variations in lighting, with the consequent loss of efficiency previously discussed.

A drawback of the prior art solutions derives from the fact that the printed circuit on which the photovoltaic cells are connected, that is to say, the array of cells, has a predetermined length and in the case of sheets which are larger or longer than the single module, it is necessary to connect several arrays by means of corresponding connectors which increase the cost of the overall system, formed by several modules, to often unacceptable values. Moreover, the fixed length of the single module might not be suitable to fully exploit the dimensions of the sheet, even by joining several arrays since the continuous sheets of glass, the glass covers and the windows rarely have standard dimensions.

The need is felt in the sector for greater versatility in the production of the arrays of photovoltaic cells and therefore in the production of LSC devices with arbitrary dimensions also to facilitate the penetration of this technology in the residential and construction sectors in general.

This need must be combined with the constraint to minimise both the number of connectors present and the current circulating inside the photovoltaic array also in order to reduce the ohmic losses, the cross-section of the conductors and, consequently, their cost.

In this context, the aim is to provide a photovoltaic module for luminescent solar concentrators that is capable of overcoming at least some of the drawbacks of the prior art and of meeting the above mentioned need.

DISCLOSURE OF THE INVENTION

In particular, the aim of the invention is to provide a photovoltaic module for photovoltaic concentrators which is easy and practical to use, versatile and relatively inexpensive.

The aim is achieved by a photovoltaic module comprising the technical features described in one or more of the accompanying claims. The dependent claims correspond to possible different embodiments of the invention.

According to a first aspect, the invention relates to a composite strip comprising a flexible printed circuit comprising at least a first and a second conductor track and a plurality of groups of photovoltaic cells connected in series wherein the groups of cells supply the conductor tracks.

The flexible printed circuit preferably has a thickness of between 0.2 and 2 mm and is made, for example, on a Kapton® support.

The groups of cells are positioned one after another along the strip and there are soldering pads between consecutive groups.

The conductor tracks are accessible at the soldering pads.

The strip is configured to be cut at the soldering pads.

Preferably, the flexible composite strip comprises a pair of tracks not electrically connected to the tracks connected to the photovoltaic cells.

Preferably, the flexible composite strip comprises a graphical indication, for example a dashed line, for identifying corresponding cutting lines which respect the electrical connections of the photovoltaic cells and the groups of photovoltaic cells.

Preferably, the flexible composite strip comprises an adhesive, for example, in the form of two-sided adhesive tape, for being joined to an edge of a corresponding luminescent sheet.

Preferably, the flexible composite strip comprises at least one electronic component for protecting the photovoltaic cells.

The electronic protective component is preferably mounted on the flexible printed circuit on the opposite side of the photovoltaic cells.

According to an aspect, the invention relates to a photovoltaic module comprising a piece of a flexible composite strip as described above.

The photovoltaic module comprises a conversion circuit soldered to the piece.

The conversion circuit has an input connected to the tracks supplied by the photovoltaic cells and an output at a predetermined voltage.

The conversion circuit is configured for converting the input voltage into the predetermined output voltage, said predetermined output voltage being the output voltage of said photovoltaic module.

Preferably, the flexible composite strip comprises a pair of tracks not electrically connected to the tracks supplied by the photovoltaic devices and the outlet of the conversion circuit is connected to the tracks.

Further features and advantages of the above-mentioned and other aspects are more apparent in the non-limiting description which follows of a preferred embodiment of a photovoltaic module for a luminescent solar concentrator.

BRIEF DESCRIPTION OF DRAWINGS

The description is set out below with reference to the accompanying drawings which are provided solely for purposes of illustration without restricting the scope of the invention and in which.

DETAILED DESCRIPTION OF PREFERRED EMBODIMENTS OF THE INVENTION

With reference to the accompanying drawings, the numeral 100 denotes a luminescent solar concentrator.

Figure 1:
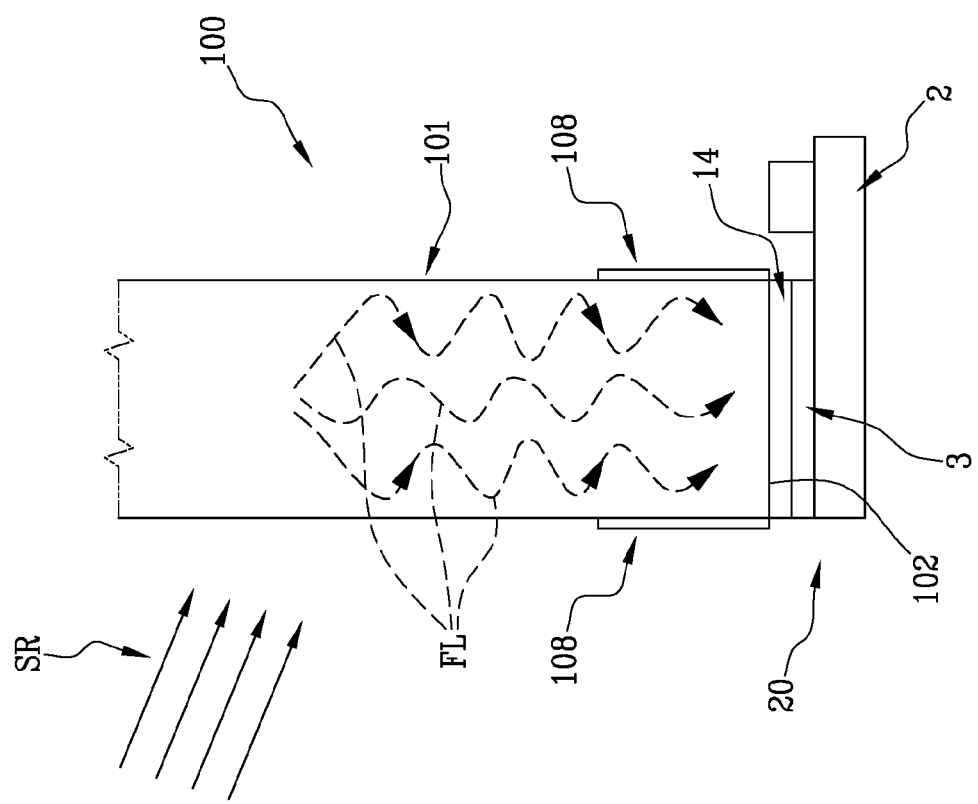
FIG. 1 is a schematic side view of a luminescent solar concentrator comprising a photovoltaic module according to the invention.

According to an embodiment, illustrated for example in FIG. 1, the concentrator 100 comprises a sheet 101 of fluorescent material, that is to say, inside of which are dispersed dyes not illustrated.

These dyes emit light or fluorescence radiation FL which propagates isotropically when, in use, the sheet is struck by the solar radiation SR.

A portion of the fluorescence radiation FL remains trapped by total internal reflection inside the sheet 101 and is conveyed towards an edge 102 of the sheet 101.

According to the invention, the concentrator 100 comprises a photovoltaic module, denoted in its entirety by the numeral 1.

The photovoltaic module 1 is applied to the sheet 101 at the edge 102 and along it.

Figure 2:
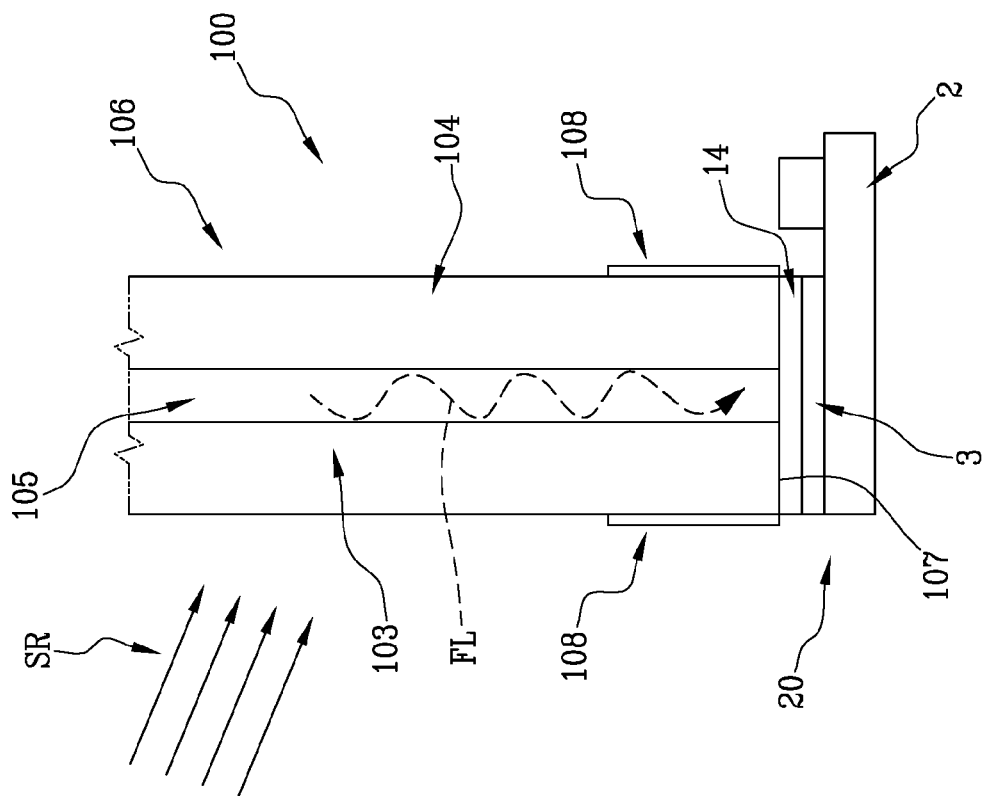
FIG. 2 is a schematic side view of a luminescent solar concentrator comprising a photovoltaic module according to the invention.

According to an embodiment, illustrated for example in FIG. 2, the concentrator 100 comprises a sheet of glass 103, a sheet of glass 104 and a film 105 interposed between the sheets of glass 103 and 104 to form a layered sheet 106.

A plurality of dyes is dispersed in the film 105 making it luminescent.

A portion of the fluorescence radiation FL remains trapped by total internal reflection in the film 105 and is conveyed towards an edge 107 of the sheet 106.

The concentrator 100 comprises the photovoltaic module 1 applied to the sheet 101 at the edge 107 and along it.

The sheet 101 and/or the plate 106 may be coated with a reflective material 108, preferably at the respective edges 102, 107, in order to minimise optical losses close to the module 1.

The photovoltaic module 1 defines a photovoltaic receiver for the concentrator 100.

The module 1 comprises a flexible printed circuit 2.

The flexible printed circuit 2 preferably has a thickness of between 0.2 and 2 mm. For example, the flexible printed circuit 2 made on a Kapton® support.

The module 1 comprises a plurality of photovoltaic or solar cells 3 soldered on the printed circuit 2.

According to an embodiment, the cells 3, schematically illustrated in the accompanying drawings, such as a diode representing the equivalent circuit, are divided into groups 4 consisting, for example, of five cells 3 connected in series.

According to alternative embodiments, the groups 4 comprise four cells 3 or six cells or any other number on the basis of the desired performance.

The groups 4 of the module 1 are identical to each other and connected in parallel and provide as output a predetermined voltage determined by the number and type of relative cells 3.

The photovoltaic module 1 comprises a plurality of groups 4 of photovoltaic cells 3 connected in series to each other. The groups 4 of cells are connected in parallel in such a way as to provide a voltage equal to that of the single group, raising the current.

Preferably, the single solar cell 3 has dimensions less than or equal to 20×20 mm and, preferably less than or equal to 10×10 mm.

The groups 4 of cells 3 preferably have a length less than or equal to 10 cm and even more preferably less than or equal to 5 cm.

Preferably, the photovoltaic module 1 comprises electronic components for protecting the photovoltaic cells 3, mounted on the printed circuit 2 on the opposite side of the cells 3.

Figure 3:
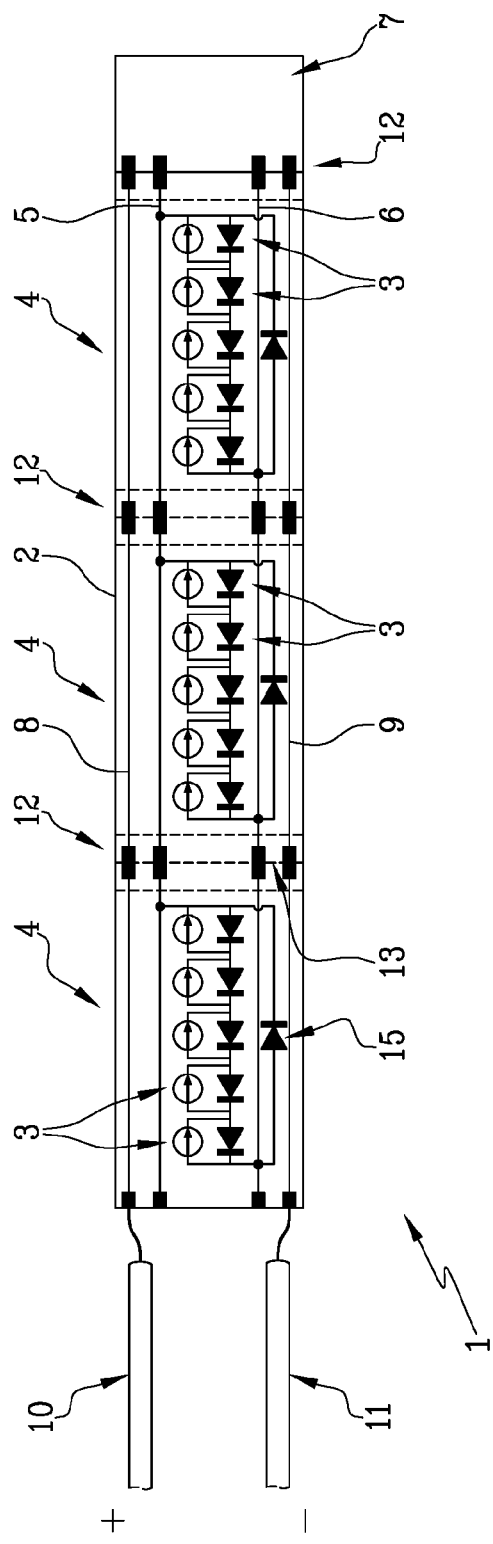
FIG. 3 is a schematic plan view of a photovoltaic module according to the invention.
Figure 4:
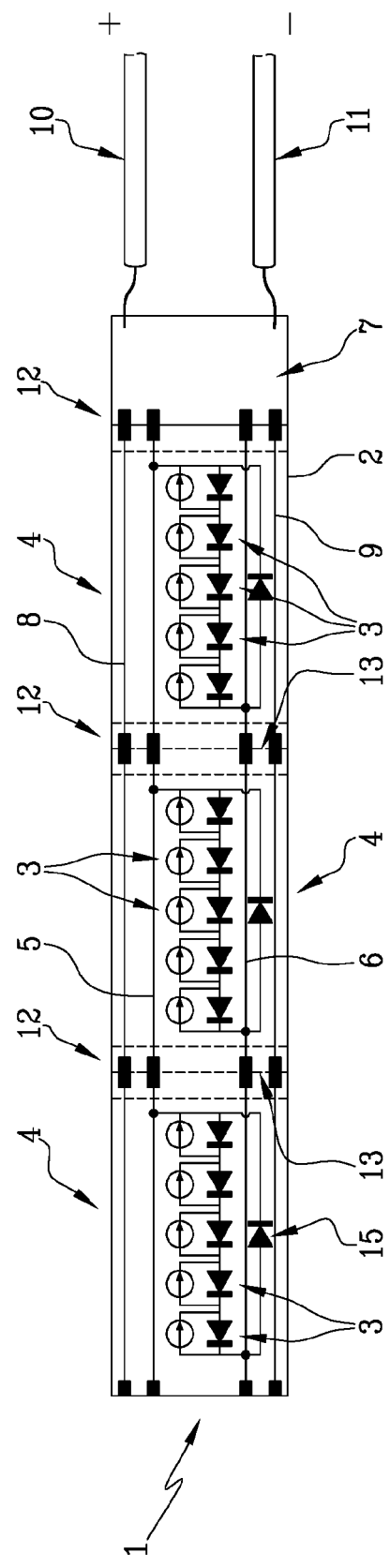
FIG. 4 is a schematic plan view of a photovoltaic module according to the invention.
Figure 5:
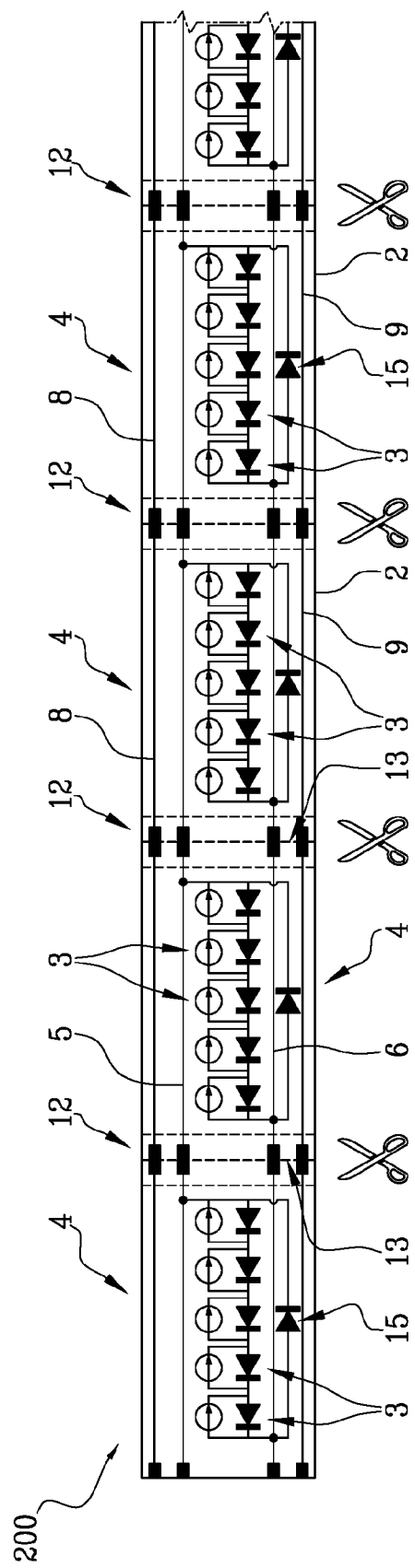
FIG. 5 is a schematic plan view of a composite strip according to the invention.

The protective components may comprise, for example, bypass diodes or varistors. For example, FIGS. 3, 4 and 5 illustrate bypass diodes, labelled 15, each connected in antiparallel to a corresponding group 4 of photovoltaic cells 3.

The printed circuit 2 comprises a first and a second track 5, 6 for connecting the groups 4 in parallel. The groups 4 are connected in parallel to the tracks 5, 6.

The tracks 5, 6 define a direct current output, as a function of the number of groups 4 connected in parallel, supplied by the groups 4 themselves.

According to an embodiment, the printed circuit 2 comprises a third and a fourth track 8 and 9 not directly connected to the photovoltaic cells 3, as described in more detail below.

With reference to the module 1, the printed circuit 2, together with the groups 4 of photovoltaic cells 3 connected in parallel to the tracks 5 and 6, and, if necessary, the protective devices, are preferably one piece 20 of a flexible composite strip 200 comprising the flexible printed circuit 2, in the form of a strip, comprising the tracks 5, 6, 8 and 9 (if provided), to which a succession of groups 4 is soldered.

The strip 200 is referred to as composite since it comprises several components.

As described in more detail below, the piece 20 is preferably cut by the strip 200.

The groups 4 supply, in the strip 200 as in the piece 20, the tracks 5, 6 which define a direct current output supplied by the groups 4.

Preferably, the dimensions of the cells 3 are small enough to allow the strip 200, and hence the module 1, to have a longitudinal radius of curvature of less than 10 cm and more preferably less than 5 cm.

The module 1 comprises a conversion circuit 7 configured to convert the input voltage to an output voltage having a predetermined value, that is to say, to a predetermined voltage, for example 18V.

According to an embodiment, the circuit 7 has an inlet connected to the tracks 5, 6 and an outlet connected to the tracks 8 and 9.

According to an embodiment, the output of the circuit 7 is directly used or can be used for powering further devices.

According to an embodiment, the output of the circuit 7 can be directly used or is usable for supplying further devices and is connected to the tracks 8 and 9 for carrying the predetermined voltage also to an opposite end of the module 1.

In this way, the output of the photovoltaic module 1 has a standard electrical characteristic regardless of the length of the module 1, that is to say, the length of the piece 20.

In general, the DC-DC type output of the conversion circuit 7 has the output at the above-mentioned predetermined voltage.

In practice, the conversion circuit 7 is supplied by means the tracks 5, 6 and provides as output the predetermined voltage, for example 18 volts, which can be directly used or used by means of the tracks 8 and 9.

According to an embodiment, the conversion circuit 7 is made on a flexible printed circuit.

The conversion circuit 7 comprises, for example, a DC-DC step-up converter 7a, of substantially known type, which increases the potential difference supplied by the groups 4 of cells 3 of the piece 20.

According to an embodiment, the flexible conversion circuit 7 is configured to perform a tracking of the maximum power point, that is to say, it is configured for modifying the working point of the photovoltaic devices present in the piece 20 in order to optimise the electrical efficiency of the module 1.

According to an embodiment, the module 1 comprises the two tracks 8, 9 connected to the output of the conversion circuit 7, that is, supplied at the predetermined voltage.

According to a simpler embodiment, the module 1, that is to say, the flexible printed circuit on which it is made, does not have the two tracks 8, 9 and the predetermined output voltage is available at the conversion circuit 7.

Reference is made hereinafter to four tracks without limiting the scope of the invention.

Figure 7:
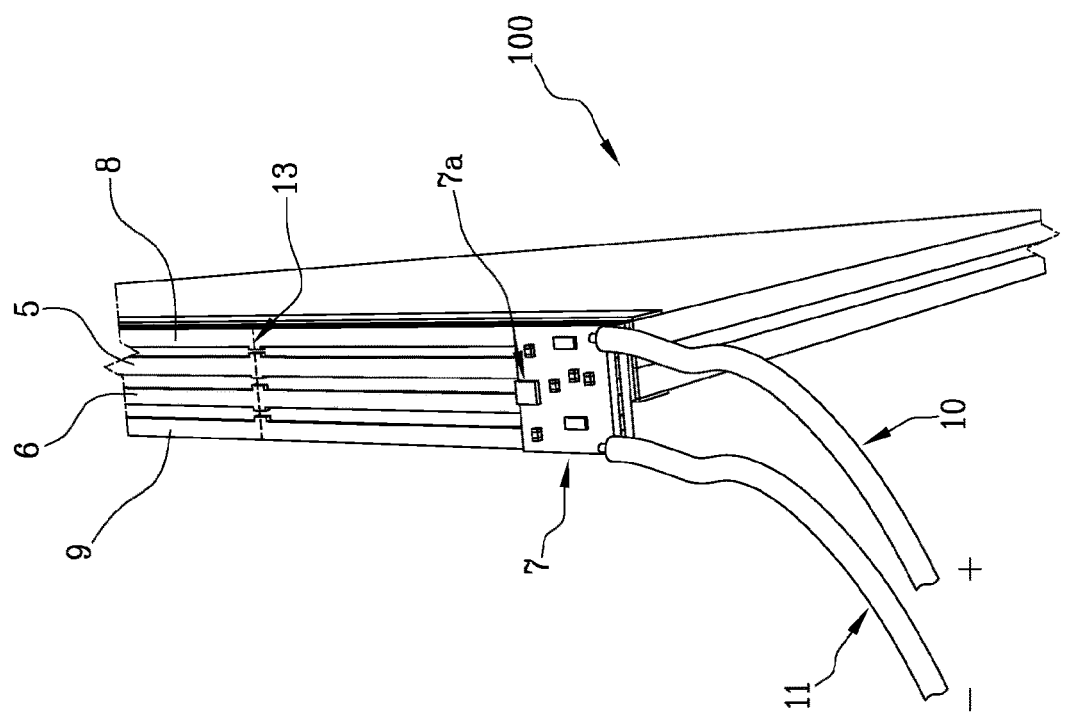
FIG. 7 is a schematic perspective view of a luminescent solar concentrator comprising a photovoltaic module according to the invention.
Figure 6:
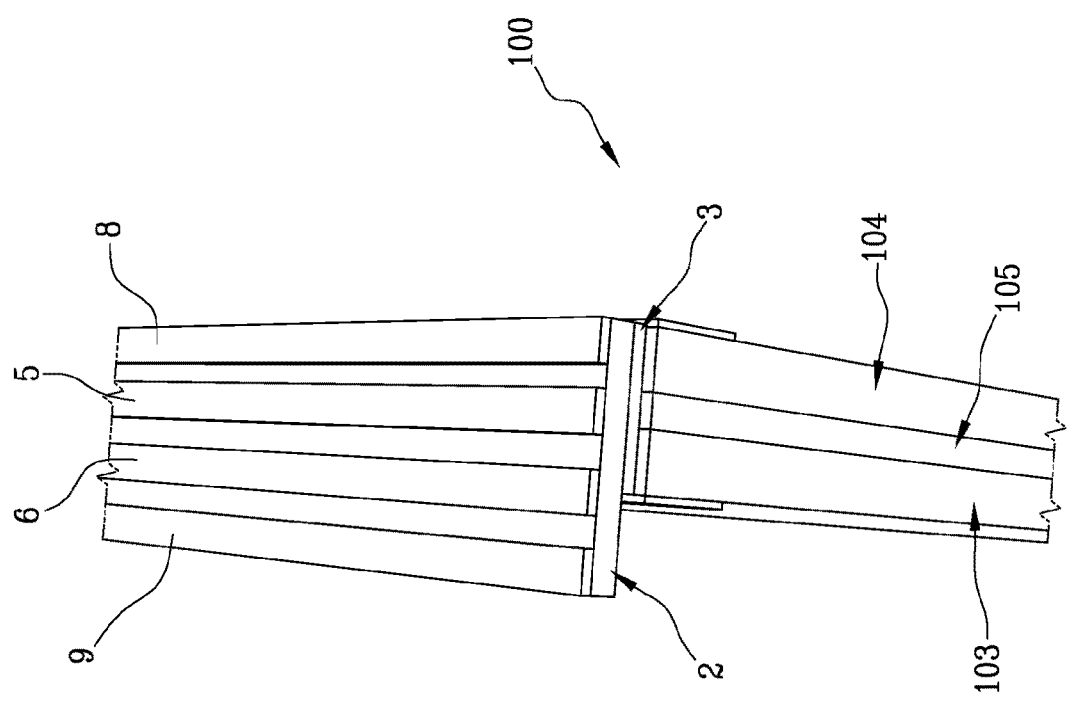
FIG. 6 is a schematic perspective view of a luminescent solar concentrator comprising a photovoltaic module according to the invention.

As illustrated in FIG. 7, according to an embodiment, the module 1 comprises a pair of conductors 10, 11, soldered to the tracks 8, 9 to which, for example, if necessary, connectors for photovoltaic systems may be connected.

In practice, the tracks or conductors 5, 6 transport the current delivered by each group 4 of cells 3 towards the DC-DC conversion circuit which raises the voltage delivered by each group 4 of cells 3 to a value such that it can be interfaced with external DC-AC converters or low voltage users (<50V).

Substantially at the ends of each group 4 along the strip 200, the strip 200 comprises soldering pads 12 at which the conversion circuit 7 can be soldered to the printed circuit.

In practice, the tracks 5, 6, 8 and 9 are accessible in the soldering pads 12.

Advantageously, the strip 200 may be cut, to the desired length, in one of the pads 12 to obtain the piece 20.

The conversion circuit 7 may then be soldered to the tracks 5, 6, 8, 9 in one of the pads 12 of the piece 20, preferably at one end of it.

The conversion circuit is connected to the pads directly connected with the groups of photovoltaic devices, and with two further pads, electrically connected to a bus which allows constant voltage line and optimised for the entire length of the photovoltaic module 1.

This solution allows the positive and negative poles of the module 1 to be obtained at one end or the other of the module 1.

According to an embodiment, it is possible to keep the positive side at one end and the negative pole at the opposite end, depending on the interconnection requirements.

According to an embodiment, the tracks 5, 6, 8, 9 are thinned at the pads 12, to favour a cutting of the strip 200.

Preferably, at the pads 12, that is, between the groups 4 of cells 3 along the strip 200, the strip 200 has a graphical indication 13, for example a dashed line, to identify where to cut the strip 200 to obtain the piece 20 respecting the serial-parallel connections of the cells 3 and of the groups 4.

Each group 4 is separated from the next group 4 along the printed circuit of the strip 200 by a separation line which allows the strip 200 to be cut without adversely affecting the electrical functionality of the module 1.

According to an embodiment, the strip 200 comprises an adhesive 14, for example in the form of two-sided adhesive tape, applied to the strip 200 on the side of the cells 3 to favour a joining of the module 1 to a corresponding sheet, for example the sheets 101 and 106.

The adhesive 14 is transparent and allows the optical coupling of the photovoltaic devices with the material of the sheet.

The edge 102, 107 may advantageously be coated with reflective material 108 in order to minimise the optical losses deriving from the use of the adhesive 14 used to make the photovoltaic cells 3 adhere to the sheet 101, 106.

The solution described brings important advantages in particular in the production of luminescent solar concentrators.

The strip 200 with the cells 3 and the tracks 5, 6, 8 and 9 may be made of indefinite length and packaged, for example, in practical rolls.

Depending on the dimensions of the sheet to which the module 1 is to be applied, it is possible to cut a piece 20 of the strip 200 of suitable length, at the pads 12 and/or the dashed lines 13.

The conversion circuit 7 is then soldered to the piece 20, in particular to the tracks 5, 6, 8 and 9.

The module 1 thus obtained may be applied, for example by means of the adhesive 14, to the corresponding edge of the sheet.

In practice, the conversion circuit converts the direct current supplied by each of the groups to direct current with a voltage greater and independent of the length of the module 1.

The conversion circuit makes the output voltage of the luminescent solar concentrator constant irrespective of the size of the luminescent sheet.

In general, once the photovoltaic module is attached to the sheet, the assembly may undergo other processes, for example, sealing with silicone and/or encapsulation of the edges in dedicated profiles or other processes, not of interest in this description, for the purpose of making the luminescent solar concentrator.

The proposed solution allows the formation of a flexible photovoltaic receiver, of arbitrary length, with a constant voltage output suitable for being optically coupled to solar concentrators of different sizes.

The absence of connecting elements makes the strip extremely thin and flexible and this makes it possible to supply it in the form of long reels which can be cut according to the requirements.

In general, there are numerous and important advantages of the LSC devices compared with flat photovoltaic systems with traditional concentration. The main advantages are as follows:
a) significant reduction in the quantity of semiconductor material used;
b) collecting the direct and diffuse components of the solar radiation, which is converted with the same efficiency irrespective of the arrangement of the panel, with the consequent possibility of use both on facades exposed directly to the sun and on facades exposed only to the diffuse component, irrespective of the inclination of the capturing surface;
c) good heat dissipation due to the large area of the collector panel which is placed in contact with the outside environment. This allows the photovoltaic devices coupled to the edges of the sheet to work under reduced temperature conditions, which gives them a high conversion efficiency (the effectiveness of commercial semiconductors in fact decreases with the increase in temperature).
d) absence of solar tracking systems: this feature, which makes the LSC photovoltaic panels unique compared with the conventional CPV panels, on the one hand significantly increases the architectural integration of the devices and, on the other hand, considerably reduces the cost, weight and maintenance activities;
e) possibility of identifying dyes which allow a good degree of overlap between the emission spectrum of the dye itself and the spectral response curve of the photovoltaic cells. This allows the cells to operate whilst maximising the conversion efficiency and minimising their overheating and any damage.

The invention claimed is:

1. A flexible composite strip comprising;
a flexible printed circuit comprising at least a first and a second conductor track,
a plurality of groups of photovoltaic cells, said groups being electrically connected in parallel to said first and second conductor tracks for feeding said first and second conductor tracks and positioned in succession along said flexible printed circuit,
each of the groups of photovoltaic cells comprising a plurality of photovoltaic cells electrically connected in series,
a plurality of soldering pads at which said first and second conductor tracks are accessible, each of the soldering pads being interposed, along said flexible printed circuit, between a first and a second group of consecutive ones of the photovoltaic cells,
said flexible composite strip being configured to be cut at the soldering pads.

2. The flexible composite strip according to claim 1, and further comprising a third conductor track and a fourth conductor track not electrically connected to said first and second conductor tracks.

3. The flexible composite strip according to claim 1, and further comprising a graphical indication, a dashed line, at said soldering pads to identify corresponding cutting lines respecting the electrical connections of said photovoltaic cells and of said groups of photovoltaic cells.

4. The flexible composite strip according to claim 1, and further comprising an adhesive, in the form of a two-sided adhesive tape, applied to the flexible printed circuit above said photovoltaic cells for joining said flexible composite strip to an edge of a corresponding luminescent sheet.

5. The flexible composite strip according to claim 4, wherein said adhesive is transparent.

6. The flexible composite strip according to claim 1, wherein said photovoltaic cells have dimensions less than or equal to 20×20 mm.

7. The flexible composite strip according to claim 1, wherein said groups of photovoltaic cells have a length less than or equal to 10 cm, measured along said flexible printed circuit.

8. The flexible composite strip according to claim 1, and further comprising at least one electronic protection component for protecting said photovoltaic cells, said electronic protection component being mounted on said flexible printed circuit on an opposite side of the photovoltaic cells relative to the flexible printed circuit.

9. The flexible composite strip according to claim 1, wherein said flexible printed circuit has a thickness of between 0.2 and 2 mm.

10. A photovoltaic module comprising a piece of the flexible composite strip according to claim 1, and at least one conversion circuit soldered to said piece, said at least one conversion circuit having an input connected to said first and second conductor tracks and an output at a predetermined output voltage, said at least one conversion circuit being configured for converting a voltage at said input into said predetermined output voltage, said predetermined output voltage being an output voltage of said photovoltaic module.

11. The photovoltaic module according to claim 10, wherein said flexible composite strip further comprises a third conductor track and a fourth conductor track not electrically connected to said first and second conductor tracks, said output at a predetermined output voltage being connected to said third and fourth conductor tracks.

12. The photovoltaic module according to claim 10, wherein said at least one conversion circuit is soldered to said piece at a first soldering pad of the soldering pads at one end of said piece.

13. The photovoltaic module according to claim 10, wherein said at least one conversion circuit is made on a second flexible printed circuit.

14. The photovoltaic module according to claim 10, wherein said at least one conversion circuit is configured for modifying an operating point of the photovoltaic cells present on said piece to optimize an electrical efficiency of said photovoltaic module.

15. A kit for making at least one photovoltaic module according to claim 10, said kit comprising the flexible composite strip and at least one of the at least one conversion circuit configured to be soldered to said flexible composite strip or to a piece of said flexible composite strip, said at leat one conversion circuit having an input connectable to said first and second conductor tracks and an output at a predetermined output voltage, said at least one conversion circuit being configured for converting a voltage at said input into said predetermined output voltage, said predetermined output voltage being an output voltage of said photovoltaic module.

16. The kit according to claim 15, wherein the flexible composite strip further comprises a third conductor track and a fourth conductor track which are not electrically connected to said first and second conductor tracks, said output at the predetermined output voltage of said at least one conversion circuit being connectable to said third and fourth conductor tracks.

* * * * *